United States Patent [19]

Maerz et al.

[11] Patent Number: 5,637,438
[45] Date of Patent: Jun. 10, 1997

[54] PHOTOSENSITIVE MATERIAL AND PRODUCTION OF METAL-COLORED IMAGES UTILIZING PEARL LUSTER PIGMENT

[75] Inventors: Karin Maerz, Mainz; Silvia Neumann, Wiesbaden; Dieter Mohr, Appenheim, all of Germany

[73] Assignee: AGFA-Gevaert AG, Leverkusen, Germany

[21] Appl. No.: 344,427

[22] Filed: Nov. 23, 1994

[30] Foreign Application Priority Data

Nov. 26, 1993 [DE] Germany ............... 43 40 335.2

[51] Int. Cl.[6] ............... G03F 7/09; G03F 7/34; G03F 7/30
[52] U.S. Cl. ............... 430/253; 430/162; 430/166; 430/252; 430/273.1; 430/292; 430/325; 430/326; 430/327
[58] Field of Search ............... 430/143, 273, 430/292, 293, 358, 273.1, 162, 166, 252, 253, 325, 326, 327

[56] References Cited

U.S. PATENT DOCUMENTS

| | | | |
|---|---|---|---|
| 4,489,153 | 12/1984 | Ashcraft et al. | 430/253 |
| 4,895,787 | 1/1990 | Platzer | 430/253 |
| 5,049,476 | 9/1991 | Platzer | 430/253 |
| 5,122,437 | 6/1992 | Matthews et al. | 430/291 |

FOREIGN PATENT DOCUMENTS

| | | |
|---|---|---|
| A-0129028 | 12/1984 | European Pat. Off. . |
| 0 165 031 | 12/1985 | European Pat. Off. . |
| A-0197396 | 10/1986 | European Pat. Off. . |
| A-0 437343 | 7/1991 | European Pat. Off. . |
| A-0503402 | 9/1992 | European Pat. Off. . |
| A-0525624 | 2/1993 | European Pat. Off. . |
| 0 550 338 A1 | 7/1993 | European Pat. Off. . |

OTHER PUBLICATIONS

Chemical Abstracts, vol. 90, 1979, p. 436, Abstract No. 90:144322n: Photoimaging Process. Moriya, Takeo; Yamagata, Toshio (Kimoto and Co., Ltd.). Jpn. Kokai Tokkyo Koho 78, 123, 130, Oct. 27, 1978.

*Primary Examiner*—Christopher G. Young
*Attorney, Agent, or Firm*—Foley & Lardner

[57] ABSTRACT

Described is a photosensitive material for producing metal-colored images, comprising A) a flexible transparent plastic support film,
B) a photosensitive layer comprising a polymeric binder, a photosensitive substance and a pearl luster pigment, and optionally
C) a thermoplastic adhesion-promoting layer.

The material of the invention makes it possible to produce color-proofing images for metal-colored multicolor prints by combining metal-colored single-color images with single-color images in the usual primary colors as desired.

20 Claims, No Drawings

PHOTOSENSITIVE MATERIAL AND PRODUCTION OF METAL-COLORED IMAGES UTILIZING PEARL LUSTER PIGMENT

The invention relates to a photosensitive material for producing colored images, in particular color-proofing films, in metallic effect colors, which are used as decorative and specialty colors in multicolor printing. It also relates to a process whereby single-color images in metallic effect colors can be applied in register to a colored proof following its production.

Multicolor offset printing today is marked by rising print quality expectations. Specialty colors and upgrading through gold, silver and other metallic effects are becoming increasingly important, especially in the packaging sector. While many specialty colors can be produced by blending or superprinting the basic colors of multicolor printing, the production of metallic effects is not possible in this way.

A known way of producing metallic effects on color-proofing images involves an imagewise tonering with toner powder in metallic effect colors (U.S. Pat. No. 5,122,437), comparable with the bronzing of offset prints. In the course of the process, a photopolymerizable, colorless layer is subjected to imagewise exposure. The step of exposure alters the adhesivity of the surface of the photopolymerizable layer, so that the difference in the tackiness of image and non image areas permits imagewise tonering. Metallic effects can be obtained in this way through the use of specific toners (e.g. "Cromalin® metallic gold"). The process is suitable not only for positive- but also for negative-working color-proofing systems, provided adequate tackiness differentiation is obtained. The advantage of this process is that the impression of the image is not distorted by additional support layers. A disadvantage is the complicated and laborious handling of the toner powder.

A further way of producing metallic effects on color-proofing images is a process wherein, following completion of a color-proofing image, decorative colors are produced by specific photosensitive metal foils, as expressed in JP-A-123 130/78 (Chem. Abstr. 90/144 322). These foils are polyester films coated with metals or metal compounds. Atop the metal layer is situated a photosensitive layer with or without at least one top layer. The material is subjected to imagewise exposure on the side of the photosensitive layer, treated with hot water at 60° C. for about three minutes, and developed by peeling off the photosensitive layer, if appropriate together with the top layers, leaving behind the metal layer in the exposed areas of the polyester support film to produce in these areas a metal-colored negative of the exposure mask. In the case of negative-working processes operating according to the overlay principle (e.g. as described in U.S. Pat. No. 4,489,153), the peeled-off metal foil negative can be used directly. In the case of negative-working surprint processes (e.g. as described in EP-A-0 165 031), this metal image can be laminated onto a ready-produced color-proofing image. It may be necessary, before the laminating of the metal image, to apply an additional adhesion-promoting layer to the surface of the proof or metal image. Since the peeled-off photosensitive layer which carries the positive metal image will discolor under the action of light owing to the substances (diazonium compounds) it contains, the positive, by contrast, is unsuitable for color-proofing methods.

The main disadvantages of this process for producing metallic effects, which is restricted to negative-working systems, are the required use of hot water for development, which makes it difficult to achieve the necessary uniformity especially in the case of large formats, and the fact that the 100 μm polyester support film remains behind on the proof image surface, so that light scattering effects distort the impression of the image, which impression is decisive for the quality of a color-proofing method.

EP-A-550 338 describes a process and material for producing metal-colored color-proofing images by laminating a photosensitive material composed of a temporary support film, a metal-colored pigment layer, a color pigment layer, a photoresist layer, optionally an adhesion-promoting layer and further interlayers onto on image-receiving material, subjecting the photosensitive material to imagewise exposure, and developing the exposed image by washing out. Each pigment layer can also be a photoresist layer. The material has two pigment layers through which it has to be exposed. This complicates the exposure and the subsequent development by washing out. Development by peeling apart is not possible with these doubled pigment layers.

Another color-proofing method and a material therefor are known from U.S. Pat. No. 4,895,787 and U.S. Pat. No. 5,049,476. This material consists of a transparent support film, a photosensitive layer comprising a dye or a color pigment in a primary color of the multicolor printing, and a thermoplastic, heat-activable adhesion-promoting layer atop the photopolymerizable layer. After lamination onto an image receiver, the material is subjected to exposure through the support film and then developed by peeling apart the support film and the image receiver. This leaves the exposed areas of the photosensitive color layer adhering to the support film, while the unexposed areas remain on the image receiver together with the entire adhesion-promoting layer.

It is an object of the present invention to propose a photosensitive material for producing metal-colored images which is convenient and reliable to process as a customary color-proofing material and is in particular combinable with single-color or multicolor images obtained from such material without having to alter processing parameters.

This object is achieved by a photosensitive material for producing metal-colored images, comprising A) a flexible transparent plastic support film,
B) a photosensitive layer comprising a polymeric binder, a photosensitive substance and a pigment, and optionally
C) a thermoplastic adhesion-promoting layer, wherein the pigment is a pearl luster pigment.

The photosensitive material of the invention may, in addition to the indicated layers (A), (B) and (C), contain further layers, for example separating layers or temporary cover films.

The pearl luster pigments used in the material of the invention are known and described for example in Ullmann, Encyclopedia of Industrial Chemistry, Verlag Chemie, Weinheim 1988, Volume 20, chapter 4.3, pages 347 ff; in "Perlglanzpigmente", by R. Maisch and M. Weigand in Bibliothek der Technik, Volume 56, Verlag Moderne Industrie, Landsberg/Lech (1991), and in U.S. Pat. No. 4,134,776 and U.S. Pat. No. 4,344,987. The above-cited EP-A-550 338 likewise describes pearl luster pigments. The pearl luster pigments are preferably inorganic in nature. They generally comprise support materials which preferably consist of transparent mineral particles, for example sheet-silicates, which usually have diameters of less than 50 μm, preferably from 5 to 20 μm. These particles, which are frequently in the form of platelets, have been coated at the surface with a white or color pigment or with a dye. Preferred examples of pigments are metal oxides, such as iron oxides, titanium dioxide, chromium oxide or the like, other inorganic pigments such as Prussian Blue or else organic pigments such as carmine red or thioindigo.

The advantages of pearl luster pigments over conventional metal pigments are their low density and their transparency. The low density permits the production of color films by coating the support films from a solution which contains the pigments in the form of a dispersion. The transparency ensures adequate access of the light to the constituents of the photosensitive layer during exposure.

The pearl luster pigments used determine the decorative color to be produced later. And the transparency of the pearl luster pigments makes it possible to create interesting mix-effects by mixing the pearl luster pigments with other color pigments or dyes. For instance, the addition of small amounts of a black pigment [e.g. ®Printex 25 (carbon black)] to a white pearl luster pigment makes it possible to produce the decorative color of silver. Examples of suitable commercially available pearl luster pigments are: ®Iriodin 111 Rutile Fine Satin, Iriodin 123 Bright Lustre Satin, Iriodin 302 Goldsatin, Iriodin 323 Royalgoldsatin and Iriodin 520 Bronzesatin (E. Merck GmbH, Darmstadt). The choice of pigments also depends on the thickness of the layer in which they are used. In the case of the photosensitive layer of the material according to the invention, the thickness is generally from 0.5 to 20 µm, preferably from 1 to 10 µm. If the platelet diameter of the pearl luster pigments is too large, this in many cases results in the color-proofing sheets produced therewith having poor resolution. For this reason, pearl luster pigments which, like the examples mentioned, have a platelet diameter of less than 20 µm are particularly suitable.

The pearl luster pigments are stirred into a binder solution of the binder for the photosensitive layer and a suitable solvent for this binder. The dispersing process should not be carried out in a bead mill, since this would destroy the platelet structure of the pearl luster pigments, which is necessary for obtaining the luster effect. A coating process whereby the pigment platelets can form themselves into a parallel arrangement with the surface, e.g. coating by means of slot dies or by knife-coating, is particularly advantageous for the luster effect.

The polymeric binder shall confer homogeneity and strength on the layer. Suitable binders include styrene-maleic anhydride and styrene-maleic monoester copolymers, acrylic ester polymers and copolymers, polyamides, polyvinylpyrrolidones, cellulose derivatives, such as cellulose esters and ethers, phenolic resins, polyvinyl esters, polyvinyl acetals, for example polyvinyl butyral, propional or formal. The proportion of binder is generally from 15 to 70, preferably from 20 to 50, % by weight, based on the weight of the solid layer.

The further composition of the photosensitive layer depends on the desired method of working, i.e. whether the layer is to be processed into positive or negative images and whether the development is to take place by washing out or peeling apart, and is hereinafter described for the various systems.

If the material is to be developed by peeling apart to produce a positive surprint color proof or a negative overlay proof, the photosensitive layer comprises as central constituents the above-described polymeric binder or binder mixture, a free-radically polymerizable compound, a photoinitiator or photoinitiator combination, and one or more color pigments, of which at least one is a pearl luster pigment.

The polymerizable compound contains at least one, preferably at least two, terminal free-radically polymerizable double bonds and is not gaseous at temperatures below 100° C. and at atmospheric pressure. Preference is given to esters and amides of acrylic and methacrylic acid. Particularly the esters with polyhydric alcohols are advantageously used. Examples are di-, tri-, tetra- and polyethylene glycol di(meth)acrylate, the di(meth)acrylates of oligo- and polypropylene glycols, 1,4-butanediol di(meth)acrylate, trimethylolpropane and trimethylolethane di- and tri(meth)acrylate, pentaerythritol tri- and tetraacrylate or -methacrylate, dipentaerythritol tetra-, penta- and hexa (meth)acrylate. The proportion of polymerizable compound is generally from 15 to 70, preferably from 20 to 60, % by weight.

Suitable photoinitiators include essentially all compounds or compound combinations known for this purpose. Examples include benzoin ethers, benzil ketals, polycyclic quinones, benzophenone derivatives, triarylimidazolyl dimers, photosensitive trihalomethyl compounds, e.g. trichloromethyl-s-triazines. Of advantage are 2,3-bisarylquinoxalines as described in U.S. Pat. No. 3,765,898, and 2-aryl-4,6-bistrichloromethyl-s-triazines. The amount of photoinitiator or photoinitiator combination is generally between 1 and 25, preferably between 3 and 15, % by weight.

The photopolymerizable layer may optionally contain further constituents, such as hydrogen donors, sensitizers, polymerization inhibitors, plasticizers, residue dissolvers, surfactants, planarizers, lubricants, adhesion promoters, antistats, inert fillers, optical brighteners and/or UV absorbers.

The photosensitive layer then has applied to it a thermally activable adhesion-promoting layer which comprises a thermoplastic binder. The adhesion-promoting layer should have a softening temperature of 40°–200° C., preferably of 60°–130° C. It can either be applied directly to the photosensitive layer, from a solvent or solvent mixture, or else first be applied to a temporary support film and dried. From the temporary support film, the adhesion-promoting layer can then be transferred either to the photosensitive layer or to an image-receiving material by lamination and peeling off of the support film. If the transfer is to the image-receiving material, then the photosensitive layer is laminated in a second step to the adhesion-promoting layer thus obtained. The direct application of the adhesion-promoting layer to the photopolymerizable layer from solvents is preferred. Suitable solvents which do not dissolve the photosensitive layer are water and saturated hydrocarbons. Many polymers can also be applied from dispersion.

Suitable binders include all polymers with which an adhesion-promoting layer having the stated softening temperature can be produced. Particular preference is given to vinyl acetate, acrylate or methacrylate homopolymers and copolymers. It is also possible to use with advantage a mixture of polymers and the addition of adhesion promoters and plasticizers. To reduce the surface tackiness it is possible to add particles which do not dissolve in the solution of adhesion-promoting components (U.S. Pat. No. 4,889,787). Particular preference is given to silica-containing pigments. As further ingredients the adhesion-promoting layer may contain residue dissolvers, planarizers, lubricants, antistats, optical brighteners and/or UV absorbers. In the dry state the adhesion-promoting layer normally has a weight from 2 to 30, preferably from 3 to 15, g/m$^2$.

To carry out the process of the invention, the above-described material is laminated with the adhesion-promoting layer face down onto an image-receiving material. The latter can be plastic, plastic-coated specialty paper or printing paper. The image-receiving material may also already carry single-color images produced by a known color-proofing method. A printing paper which is dimensionally stable under the conditions of lamination or a color-proofing image produced as described in U.S. Pat. No. 4,895,787 or U.S. Pat. No. 5,049,476 is preferred for use as receiving material for the metallic effect images of the invention.

The laminating step is advantageously carried out in a suitable apparatus under pressure and at elevated temperature. The laminating temperature is usually within the range from 60° to 130° C. Prior to or preferably after the laminating step the material is subjected to imagewise exposure through the support film under a positive mask. After exposure, the support film is peeled off by hand or in a suitable apparatus. The peel angle should be at least 90°; an angle of 180° is preferred. The exposed areas of the photopolymerizable layer are removed with the support film, while the unexposed areas remain behind on the image-receiving material together with the entire adhesion-promoting layer. This gives a positive, metal-colored image.

This process has the considerable advantage that development requires no alkaline or acid solutions and no organic solvents and hence obviates any need for their disposal.

In another embodiment of the process according to the invention, the material can be processed in such a way as to give a negative surprint color proof by peel-apart development. The construction of the material is identical to that of the above-described material for a positive-working peel-apart color-proofing method. The difference is in the method of processing. To obtain a negative image of the original on the image-receiving material, the laminating step is followed by removing the support film by peeling. Left behind on the receiving material are the adhesion-promoting layer and the unexposed photosensitive layer, which is then subjected to imagewise exposure under a color separation film. After exposure, a transparent polyester film, which is preferably adhesion-promoted on one or both sides and which may also, if desired, be the support film peeled off after the laminating step, is laminated onto the imagewise exposed layer. Following this laminating step, the entire layer is afterexposed through the polyester film. The polyester film is subsequently peeled off; this leaves behind the imagewise exposed and hence photopolymerized areas together with the adhesion-promoting layer on the image-receiving material, while the unexposed areas which have only become photopolymerized in the course of the after exposure are removed together with the polyester film. A negative image of the original remains behind on the receiving sheet. The processes operating according to this principle are known and described for example in U.S. Pat. No. 4,987,051.

If the photosensitive material according to the invention is to be positive-working and developable by washing out, the photosensitive layer, in addition to the polymeric binder or binder mixture described and the pearl luster pigment, contains a quinonediazide or a diazonium salt as photosensitive substance. Preference is given to an ester of an o-quinonediazidesulfonic acid (e.g. 1,2-naphthoquinone 2-diazide-4-sulfonic acid) and a compound having at least one phenolic hydroxyl group (e.g. 2,3,4-trihydroxybenzophenone).

It is further of advantage for a separating layer to be present between the support film and the photosensitive layer described. Preferred constituents of such a separating layer are polyvinyl alcohol or partially hydrolyzed polyvinyl acetates.

After the above-described adhesion-promoting layer has been applied to the photosensitive layer, the material of the invention is laminated with this adhesion-promoting layer face down onto an image-receiving material by means of heat and pressure; the temporary support film is removed, and the laminate is exposed under a mask for the metallic effect colors. The imagewise exposed layer can be developed in known manner with aqueous alkali. This removes the exposed areas, while the unexposed image areas remain behind on the image-receiving material together with the entire adhesion-promoting layer and constitute a positive image of the exposure mask.

The aqueous developers may contain for example alkali metal phosphates, silicates, sulfates and/or hydroxides and also wetting agents with or without small amounts of organic solvents.

A negative-working material which is developable by washing out is prepared and processed as follows:

The photosensitive layer, in addition to the polymeric binder or binder mixture described and the pearl luster pigment, in this case preferably contains a polymeric diazo compound as photosensitive substance. However, corresponding materials which are based on photopolymers are also known (U.S. Pat. No. 4,629,680 and U.S. Pat. No. 4,624,910). The polymeric diazo compound can be for example a polycondensation product of a p-diazodiphenylamine and formaldehyde. Further examples of polymeric diazo compounds are described in the literature (e.g. in U.S. Pat. No. 4,650,738, EP-A-0 165 031 and U.S. Pat. No. 3,849,392). The adhesion-promoting layer described is applied to the photosensitive layer. The material may also contain additional layers such as separating layers or oxygen barrier layers.

The material of the invention is laminated with the adhesion-promoting layer face down onto a temporary or permanent image-receiving material; preferably the temporary support film is removed and the laminate is exposed under a mask. However, exposure can also take place through the support film before the laminating step. The imagewise exposed layer can be developed in known manner with developers, preferably based on aqueous alkali. Development removes the unexposed areas whereas the exposed image areas remain behind on the image-receiving material together with the entire adhesion-promoting layer and form a negative image of the exposure mask.

The examples which follow illustrate the invention. All percentages and quantitative ratios are by weight.

EXAMPLE 1

Preparation of pearl luster pigment dispersions 1.1 Gold

A binder solution was prepared from

| 10 parts by weight of | polyvinyl formal (Formvar ® 12/85, Monsanto), and |
|---|---|
| 70 parts by weight of | γ-butyrolactone. |

To this binder solution were added 20 parts by weight of the pearl luster pigment Iriodin 323 Royalgoldsatin (support material mica, C.I. 77 019; coated with the pigment iron(III) oxide, C.I. 77 491; titanium dioxide (rutile) C.I. 77 891 and tin dioxide, C.I. 77 861). The pigment was incorporated into the binder solution with an hydraulically actuated stirrer equipped with a dissolver disk, i.e. a horizontally disposed circular disk of stainless steel having axially protruding teeth. The stirring time was 1 hour at 3700 rpm.

1.2 Bronze 20 parts by weight of the pearl luster pigment Iriodin 520 Bronzesatin (support material mica, coated with iron(III) oxide) were incorporated into the binder solution of 1.1 as described in 1.1.

1.3 Silver 20 parts by weight of the pearl luster pigment Iriodin 123 Bright Lustre Satin (support material mica, coated with rutile and tin dioxide) were incorporated into the binder solution of 1.1 as described in 1.1. To 70 parts by weight of this white dispersion was added 0.3 part by weight of a black pigment dispersion prepared as follows:

First a binder solution was prepared from

| | |
|---|---|
| 11 parts by weight of | polyvinyl formal as in 1.1 |
| 100 parts by weight of | γ-butyrolactone. |

To this binder solution were added 13.7 parts by weight of carbon black pigment (Printex 25).

The dispersion was produced in a ball mill at 1200 rpm using glass balls having a diameter of 1 mm as grinding media.

The examples which follow describe a positive-working peel-apart process:

EXAMPLE 2

Preparation of gold, bronze and silver foils

Coating solutions of the following composition were applied to 50 μm thick, biaxially oriented and heat-set polyethylene terephthalate films pretreated on both sides for improved adhesion (®Melinex 454), and dried.

| | Parts by weight | | |
|---|---|---|---|
| Constituent | Gold | Silver | Bronze |
| Dipentaerythritol pentaacrylate | 48.2 | 48.2 | 48.2 |
| Polyvinyl formal as in 1.1 | 17.4 | 17.4 | 17.4 |
| 2-Biphenyl-4-yl-4,6-bistrichloro-methyl-s-triazine | 9.4 | 9.4 | 9.4 |
| Silicone oil as flow control agent (® Edaplan LA 411) | 0.6 | 0.6 | 0.6 |
| Gold dispersion 1.1 | 450.0 | — | — |
| Bronze dispersion 1.2 | — | 450.0 | — |
| Silver dispersion 1.3 | — | — | 450.0 |
| Tetrahydrofuran | 750.0 | 750.0 | 750.0 |
| 1-Methoxy-2-propanol | 375.0 | 375.0 | 375.0 |

The weight of each of these photosensitive layers was 2.5 g/m². Atop the photosensitive layer was applied in each case an adhesion-promoting solution of the following composition and dried:

| Constituent | Parts by weight |
|---|---|
| Polyacrylate ® Carboset XL 11, acid number 75; Tg 55° C.; $M_w$ 40,000 | 10 |
| Polyacrylate Carboset XL 37, acid number 75; Tg 42° C.; $M_w$ 30,000 | 8 |
| deionized water | 22 |

The adhesion-promoting layers each had a weight of 5.5 g/m².

These metal-colored foils were laminated in an apparatus having a heated pair of rollers at 115° C. with the adhesion-promoting layer face down onto a receiving sheet of plastic-coated specialty paper and exposed under a color separation film through the support film. The support film was then continuously peeled off the receiving sheet at an angle of 180°, leaving the unexposed layer areas behind on the receiving sheet together with the adhesion-promoting layer. A positive single-color image was obtained in gold, silver or bronze. The resolution was 30 μm.

EXAMPLE 3

Atop the photosensitive layers of Example 2 was applied in each case an adhesion-promoting solution of the following composition and dried:

| Constituent | Parts by weight |
|---|---|
| Carboset XL 11 | 20 |
| Polyacrylate Carboset XL 19, (acid number 32; Tg 26° C.; $M_w$ 30,000) | 10 |
| deionized water | 20 |

The weight of the adhesion-promoting layer was 5.5 g/m². The further processing of the foils into metal-colored images was as described in Example 2.

EXAMPLE 4

A pearl luster pigment dispersion was prepared as described in Example 1.1 from:

| | |
|---|---|
| 10 parts by weight of | polyvinyl formal as in Example 1.1 |
| 10 parts by weight of | Goldsatin pigment as in Example 1.1 |
| 10 parts by weight of | Iriodin 302 Goldsatin (support material mica; coated with iron(III) oxide and titanium dioxide (anatase) C.I. 77 891) and |
| 70 parts by weight of | γ-butyrolactone. |

This dispersion was used for preparing a coating solution of the composition indicated in Example 2 by replacing the gold dispersion of 1.1 with the same amount of the above-indicated dispersion.

Atop the photosensitive layer was in each case applied an adhesion-promoting solution of the following composition and dried.

| Constituent | Parts by weight |
|---|---|
| Polyacrylate Carboset 525, acid number 80; Tg 37° C.; $M_w$ 260,000 | 10 |
| Carboset XL 37 | 114 |
| deionized water | 208 |
| aqueous ammonia solution (25%) | 1 |

The further processing was as described in Example 2. Compared with the reddish golden images of Example 2, a lighter, yellowish golden color was obtained.

EXAMPLE 5

Color sheets were produced in the four primary colors of multicolor printing. Atop the polyester films pretreated as indicated in Example 2 were applied photosensitive color solutions of the following composition and dried:

| Constituent | Parts by weight | | | |
|---|---|---|---|---|
| | Cyan | Magenta | Yellow | Black |
| Dipentaerythritol pentaacrylate | 39.0 | 35.5 | 38.2 | 36.1 |
| Polyvinyl formal as in 1.1 | 31.3 | 36.5 | 35.4 | 28.9 |
| 2-Biphenyl-4-yl-4,6-bistri-chloromethyl-s-triazine | 9.8 | 7.8 | 9.5 | 9.6 |
| Hostaperm Blue B2G (C.I. 74160) | 19.0 | — | — | — |
| Permanent Carmine FBB (C.I. 12485) | — | 18.5 | — | — |
| Permanent Yellow GR (C.I. 21100) | — | 0.7 | 16.4 | — |
| Carbon black (Printex 25) | 0.4 | 0.5 | — | 24.8 |
| Silicone oil as in Example 2 | 0.5 | 0.5 | 0.5 | 0.6 |
| Tetrahydrofuran | 1000 | 1000 | 1000 | 1000 |
| 1-Methoxy-2-propanol | 680 | 680 | 680 | 680 |
| Butyrolactone | 190 | 190 | 190 | 190 |

The pigments were first dispersed in a ball mill with the butyrolactone and some other binder. The average particle size was below 0.2 μm. The dry weight of the color layers was 0.55 to 0.85 g/m$^2$.

Atop the photosensitive layer was in each case applied an adhesion-promoting solution of

| | |
|---|---|
| 96.57 parts by weight of | vinyl acetate-crotonic acid copolymer (95:5), |
| 1.36 parts by weight of | sodium sulfite, |
| 0.15 part by weight of | pyrogenic silica, average particle size 4 μm (® Syloid ED 4) in |
| 520 parts by weight of | water, |
| 43 parts by weight of | ethanol and |
| 8.5 parts by weight of | aqueous ammonia (25%) | and dried to a layer weight of 6.5 g/m$^2$.

One of the color sheets obtained in this way (e.g. cyan) was laminated in an apparatus with a heated pair of rolls at 115° C. with the adhesion-promoting layer face down onto a receiving sheet of paper and exposed through the support film under the corresponding color separation film. Then the support film was peeled off the receiving sheet, leaving the unexposed areas behind on the receiving sheet together with the adhesion-promoting layer. By the same method the magenta, yellow and black films were laminated in succession onto the receiving sheet on top of the preceding single-color image, exposed in register underneath the corresponding color separation, and developed by peeling off the support film.

A metal-colored color-proofing sheet of Examples 2, 3 or 4 was laminated onto the resulting color proof as receiving material and exposed under a color separation for the corresponding decorative color. The support film was peeled off. The metal-colored layer remained behind on the surface of the color proof in the unexposed areas as positive image of the original. Owing to the transparency of the pearl luster pigments, interesting mixture effects were created in those areas in which the image areas of the metal image and those of the multicolor image were in superposition. For instance, silver on top of cyan produced a blue metallic color as known from automotive paints. If these mixture effects are not wanted, the metal-colored image areas have to be positioned above the non-image areas of the four-color image. For this, the corresponding areas in the originals are masked.

EXAMPLE 6

Instead of a dry-developed four-colored proof image as in Example 5 or of plastic-coated specialty paper as in Example 2, the image-receiving material used for the metal-colored foils of Examples 2, 3 or 4 was a multicolored proof which had previously been produced using the commercial color-proofing system ®Matchprint from Minnesota Mining and Manufacturing Co. as per the appropriate directions. The laminating of the metal-colored foils takes place at 130° C. Exposure and peeling off of the support film to develop the image were carried out as described in Example 2.

EXAMPLE 7

The peeled-off support film of Example 2, which carries the exposed areas of the metal-colored photosensitive layer and thus constitutes a negative image of the original on top of the transparent support film, was used in a negative-working overlay color-proofing system (e.g. as per U.S. Pat. No. 3,136,637) for producing metallic effects. The same film can also be laminated onto an image produced by a negative-working surprint color-proofing method or onto another image-receiving sheet provided with an adhesion-promoting layer, as negative image of an original; the support film remains behind on the surface of the image.

EXAMPLE 8

Atop the multicolored color-proofing image of Example 5, equipped with a special metal color, was applied a protective layer with simultaneous matting of the bright proof surface. To this end, a matt polyester support film (Melinex® 377) was coated with the following solution and dried:

| Constituent | Parts by weight |
|---|---|
| Styrene-butadiene copolymer (Pliolite S 5 E, Tg 50–55° C., $M_w$ 71,000) | 10 |
| n-Butyl acetate | 90 |
| The layer weight was 2.3 g/m$^2$. | |

This film was laminated by means of a heated pair of rolls at 115° C. with the layer side face down onto the proof image. After the laminate had cooled down, the support film was removed by peeling. The protective layer remained behind on the proof image surface, which had simultaneously become embossed with the texture of the support film and thereby been given a matt appearance.

The following example concerns a positive-working wet-developable system:

EXAMPLE 9

Atop a 50 μm thick temporary support film of slightly matted, non-adhesion-promoted polyethylene terephthalate (®Hostaphan RN) was initially applied a separating layer of the following composition:

| Constituent | Parts by weight |
|---|---|
| Polyvinyl alcohol, degree of hydrolysis 88% | |
| $M_w$ about 30,000 | 120 |
| $M_w$ about 50,000 | 120 |
| Nonylphenol polyglycol ether | 6.7 |
| deionized water | 6800 |

After drying the weight of the separating layer was 0.8 g/m$^2$.

Thereafter a pigment dispersion was prepared as described in Example 1.1 from the following constituents:

| Constituent | Parts by weight |
| --- | --- |
| Copolymer of 14% vinyl acetate, 10% of vinyl alcohol, and 76% of vinyl propional units | 5 |
| Goldsatin pigment as in Example 1.1 | 10 |
| Propylene glycol monomethyl ether | 17.5 |
| Butyrolactone | 17.5 |

6.5 parts by weight of this dispersion were added to a solution of the following composition:

| Constituent | Parts by weight |
| --- | --- |
| Polymer of pyrocatechol monomethacrylate | 12.5 |
| o-quinone diazide of 16 parts by weight of 2,3,4-trihydroxybenzophenone and 3 parts by weight of 1,2-naphthoquinone-2-diazide-4-sulfonyl chloride | 1.0 |
| Propylene glycol monomethyl ether | 36 |
| Tetrahydrofuran | 44 |

This coating solution was applied to the support film provided with the separating layer described and dried. The weight of the photosensitive layer was 2.5 g/m².

Atop the pigmented photosensitive layer was finally applied from toluene an adhesion-promoting layer of the following composition:

| Constituent | Parts by weight |
| --- | --- |
| Pliolite S 5 E | 97 |
| ® Desmophen 1700 (linear polyester of diol and dicarboxylic acid having terminal OH groups, equivalent weight about 1420) | 3 |

This adhesion-promoting layer had a weight of 3 g/m².

The metal-colored foil thus obtained was laminated at 130° C. under pressure onto a receiving sheet. The temporary support film was peeled off and the photosensitive layer was subjected to imagewise exposure in conventional manner. Exposure was followed by development with aqueous alkali of the following composition:

| Constituent | Parts by weight |
| --- | --- |
| Water | 92 |
| Sodium octylsulfate | 3 |
| Potassium metasilicate | 3 |
| Phenoxyethanol | 1 |
| Trisodium phosphate | 1 |

A positive image of the original was obtained.

What is claimed is:

1. A photosensitive material for producing metal-colored images, which material can be developed by peel-apart, comprising in order
   A) a flexible transparent plastic support film,
   B) a photosensitive layer comprising a polymeric binder, a free-radical polymerizable compound, a photoinitiator or photoinitiator combination, and a pigment, and applied to it
   C) a thermoplastic adhesion-promoting layer,
wherein the pigment is a pearl luster pigment having a particle diameter of 5 to 50 μm.

2. The photosensitive material of claim 1, wherein the pearl luster pigment is colored.

3. The photosensitive material of claim 1, wherein the pearl luster pigment has a particle diameter of 5 to 20 μm.

4. The photosensitive material of claim 1, wherein the photosensitive layer (B), in addition to the pearl luster pigment, contains another color pigment or a dye.

5. The photosensitive material of claim 3, wherein the pearl luster pigment particles comprise a plateletlike sheet-silicate support material whose surface has been coated with a white or color pigment or with a dye.

6. The photosensitive material of claim 1, wherein the photosensitive layer, on exposure, alters its adhesion to adjoining surfaces.

7. The photosensitive material of claim 1, wherein the photosensitive layer, on exposure, alters its solubility.

8. A photosensitive material for producing metal-colored images, consisting essentially of in order
   A) a flexible transparent plastic support film,
   B) a photosensitive layer comprising a polymeric binder, a photosensitive substance and a pigment, and applied to it
   C) a thermoplastic adhesion-promoting layer,
wherein the pigment is a pearl luster pigment having a particle diameter of 5 to 50 μm.

9. A photosensitive material for producing metal-colored images comprising in order
   A) a flexible transparent plastic support film,
   B) a photosensitive layer comprising a polymeric binder, a photosensitive substance, and a pearl luster pigment, and
   C) a thermoplastic adhesion-promoting layer,
wherein the material includes only one pigment-containing layer.

10. A process for producing a metal-colored image, which comprises laminating a photosensitive material of the composition indicated in claim 1 under pressure with the adhesion-promoting layer face down onto an image-receiving material, exposing the photosensitive material imagewise through the support film by means of a color separation image before or after the laminating step, and peeling the support film together with the exposed areas of the photosensitive layer off the image-receiving material.

11. The process of claim 10, wherein the image-receiving material is a sheet of paper.

12. The process of claim 11, wherein the image-receiving material is a sheet of paper bearing a colored image applied thereto.

13. A process for producing a metal-colored image, which comprises laminating a photosensitive material of the composition indicated in claim 1 under pressure with the adhesion-promoting layer face down onto an image-receiving material, removing the support film after the laminating step, exposing the photosensitive material imagewise, laminating a transparent polyester film onto the imagewise exposed layer, subjecting the already exposed layer to a subsequent exposure through the polyester film, peeling the polyester film together with the unexposed areas of the photosensitive layer off the image-receiving material.

14. The process of claim 13, wherein the image-receiving material is a sheet of paper.

15. The process of claim 14, wherein the image-receiving material is a sheet of paper bearing a colored image applied thereto.

16. A process for producing a metal-colored image, which comprises laminating a photosensitive material of the composition indicated in claim 1 under pressure with the adhesion-promoting layer face down onto an image-receiving material, exposing the photosensitive material imagewise before or after the exposing step, and removing the exposed or the unexposed areas of the photosensitive layer by means of a developer.

17. The process according to claim 16, wherein the photosensitive material is a positive-working material and the photosensitive layer further comprises a quinonediazide or a diazonium salt as a photosensitive substance.

18. The process according to claim 16, wherein the photosensitive material is a negative-working material and the photosensitive layer further comprises a polymeric diazo compound as a photosensitive compound.

19. The process of claim 16, wherein the image-receiving material is a sheet of paper.

20. The process of claim 19, wherein the image-receiving material is a sheet of paper bearing a colored image applied thereto.

* * * * *

UNITED STATES PATENT AND TRADEMARK OFFICE
CERTIFICATE OF CORRECTION

PATENT NO. : 5,637,438
DATED : June 10, 1997
INVENTOR(S) : Karin MAERZ et al.

It is certified that error appears in the above-identified patent and that said Letters Patent is hereby corrected as shown below:

Please note that Column 12, line 18, Claim 8, after "images" insert -- , which material can be developed by peel-apart--.

Column 13, line 1, Claim 16, "1" should read --9--.

Column 13, line 4, Claim 16, "exposing" should read --laminating--.

Signed and Sealed this

Twenty-seventh Day of January, 1998

Attest:

BRUCE LEHMAN

*Attesting Officer*  *Commissioner of Patents and Trademarks*